United States Patent [19]
Freitas

[11] Patent Number: 5,828,683
[45] Date of Patent: Oct. 27, 1998

[54] HIGH DENSITY, OPTICALLY CORRECTED, MICRO-CHANNEL COOLED, V-GROOVE MONOLITHIC LASER DIODE ARRAY

[75] Inventor: Barry L. Freitas, Livermore, Calif.

[73] Assignee: The Regents of the University of California, Oakland, Calif.

[21] Appl. No.: 845,250

[22] Filed: Apr. 21, 1997

[51] Int. Cl.⁶ .................................................. H01S 3/043
[52] U.S. Cl. ........................ 372/36; 372/35; 372/50; 372/108
[58] Field of Search ................... 372/36, 35, 50, 372/108, 34

[56] References Cited

U.S. PATENT DOCUMENTS

| | | | |
|---|---|---|---|
| 5,040,187 | 8/1991 | Karpinjski | 372/50 |
| 5,357,536 | 10/1994 | Andrews | 372/50 |
| 5,394,426 | 2/1995 | Joslin | 372/50 |
| 5,764,675 | 6/1998 | Juhala | 372/50 |

*Primary Examiner*—James W. Davie
*Attorney, Agent, or Firm*—John P. Wooldridge

[57] ABSTRACT

An optically corrected, micro-channel cooled, high density laser diode array achieves stacking pitches to 33 bars/cm by mounting laser diodes into V-shaped grooves. This design will deliver>4kW/cm2 of directional pulsed laser power. This optically corrected, micro-channel cooled, high density laser is usable in all solid state laser systems which require efficient, directional, narrow bandwidth, high optical power density pump sources.

9 Claims, 8 Drawing Sheets

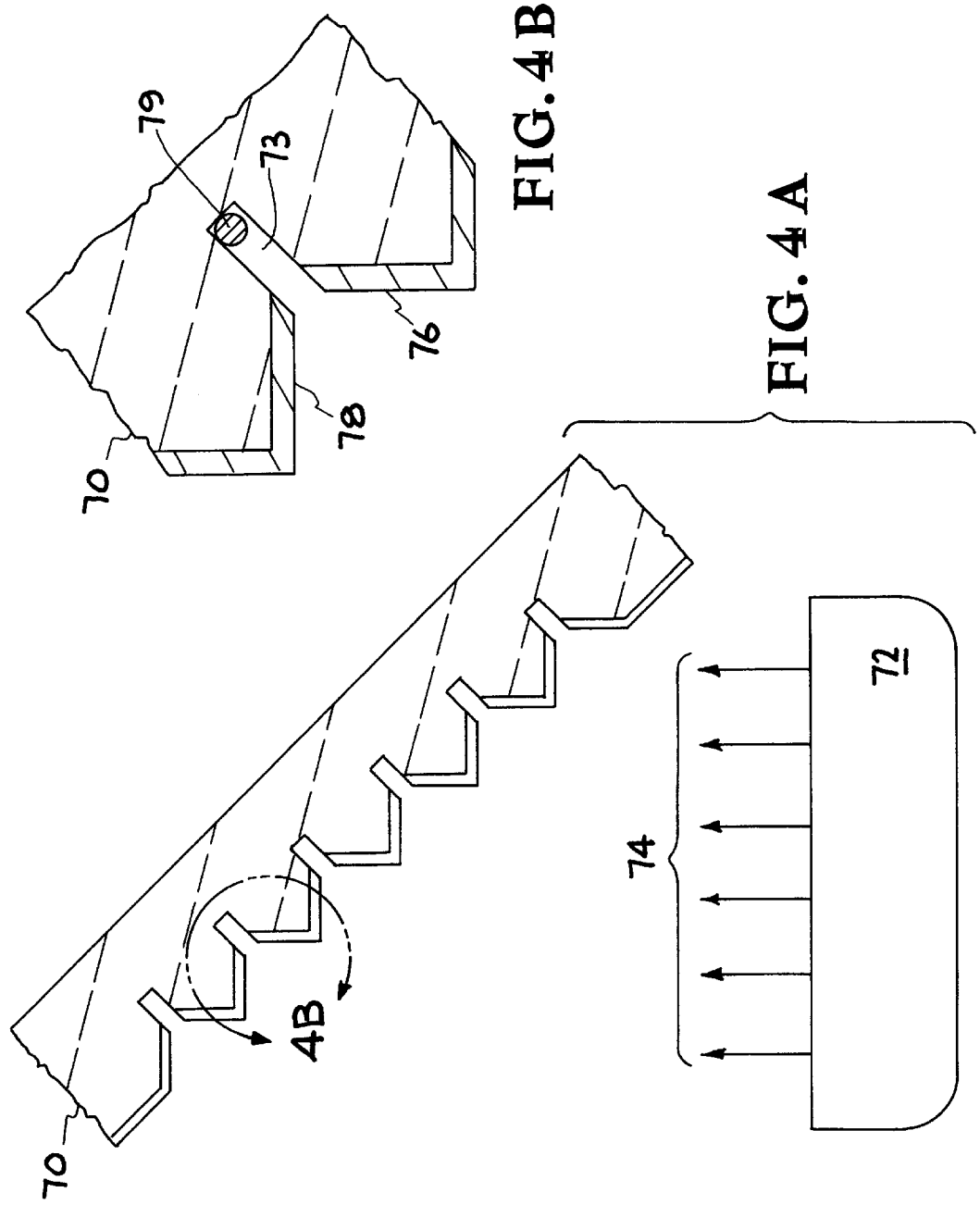

5,828,683

HIGH DENSITY, OPTICALLY CORRECTED, MICRO-CHANNEL COOLED, V-GROOVE MONOLITHIC LASER DIODE ARRAY

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to laser diode arrays, and more specifically, it relates to the use of a v-groove submount to produce high density laser diode arrays.

2. Description of Related Art

Laser diode arrays are used in a wide range of commercial, medical and military applications: materials processing (soldering, cutting, metal hardening), display technology/graphics, medical imaging (MRI) and surgical procedures (corneal shaping, tissue fusion, dermatology, photodynamic therapy), satellite communication, remote sensing and laser isotope separation. In certain solid-state laser applications it is desirable to use laser diode arrays to optically excite, i.e., "pump," the crystal hosts. Diodes offer a narrow band of emission (reducing thermal lensing), compactness, high electrical efficiency and higher reliability as compared to flash lamps. Despite these numerous advantages, however, diode-pumped solid-state lasers (DPSSLs) have gained slow market acceptance due to the high cost associated with the laser diode array pumps. Significant diode array cost reductions would enable wide deployment of DPSSLs and new architectures to be realized that were previously cost prohibitive. In particular, low-cost diode arrays would bolster the inertial confinement fusion (ICF) and inertial fusion energy (IFE) programs that require low-repetition rate laser diode arrays in very high volumes.

Historically, much of the research and development in this area was devoted to solving diode material and fabrication issues in order to improve the yield and reliability of laser diodes. High quality InAlGaAs and InGaAsP laser diodes are now commercially available for pumping Nd:YAG at ~810 nm. As much as 100 W/cm of peak power is possible under pulsed operation, and over 10,000 hours of continuous operation (CW) in commercial systems has been demonstrated at reduced power levels (20 to 30 W CW). Although these types of performance improvements have led to cost reductions in the past, there has not been a complementary improvement in the packaging technology, which is now limiting further cost reductions from being achieved.

To date, most packaging/heatsink schemes use a "rack and stack" architecture. In this method, individual laser bars are fabricated into sub-assemblies, and the sub-assemblies are then bonded together to produce larger two-dimensional arrays. Labor intensive steps associated with handling individual components prevents the production of arrays in large volume and in high yield. To alleviate this problem, a "monolithic" fabrication approach known as "bars-in-grooves" was proposed. This process was commercialized by Laser Diode Array Inc. and it represents the only "monolithic" technology that is commercially available today. There are trade offs associated with using a monolithic technique (e.g. by LDA Inc.) and the salient issues are discussed below.

The grooves must be deliberately over-sized to facilitate mounting the bars (as well as to allow for a range of diode bar thicknesses). Accurate final placement of the laser bar is therefore difficult to achieve as solder is used to fill in the void left by the over-sized grooves. This prohibits accurate collimation (lensing) of the laser diodes which is desirable in "high-brightness" applications that are often used in "end-pumped" geometries. More importantly, flowing solder around the bars can damage, or short-out bars which lowers yield and represents a serious liability to packaging costs of a completed array. Either that, or the strict process controls and/or lower yield of "suitable" bars that is necessary poses a cost penalty with this soldering technique. The following invention improves upon the limitations of the former "bars-in-grooves" method, while still benefiting from being a monolithic or quasi-monolithic approach. The placement of the laser diodes is well defined, and the soldering process can be extremely well controlled, or not used at all, which ensures a high yield that is crucial for a low-cost high yield production of laser diode arrays. It is emphasized that in the description by Karpinski et al. (U.S. Pat. No. 5,040, 187), there is a method for flexing the substrate in order to facilitate loading laser bars. However, both the groove width and diode bar thickness would have to be controlled to such a high level of accuracy that this approach appears to be impractical.

SUMMARY OF THE INVENTION

It is an object of the present invention to provide a high density, optically corrected, microchannel cooled, v-groove monolithic laser diode array.

The invention is a 2 dimensional laser diode array having a geometry that combines advanced packaging entities, (e.g., corrective micro-lens, high optical power density and high thermal power heat sink). This design achieves laser diode densities to 33 bars/cm, which is 40% greater than other geometries, (e.g. diodes in slot type grooves). This design provides the precision location of laser diodes which is necessary to couple to a prefabricated array of micro-lenses. The precision is accomplished through etching or by using a silicon dicing saw with a V-shaped saw blade. The dicing saw accuracy is <3 micrometers and the design of the V-groove allows 2 precision planes for the laser diodes to locate on. In one embodiment, the laser diodes are mounted into a right angled groove tilted 45 degrees from the silicon wafer plane. When mounted with this technique the laser diode density reaches 33 bars/cm.

BRIEF DESCRIPTION OF THE DRAWINGS

FIG. 4A shows an example on how to apply solder without metalizing across the electrical isolation groove.

FIG. 4B shows the completed metalization layer of FIG. 4A.

DETAILED DESCRIPTION OF THE INVENTION

The invention is a laser diode array that includes the highest density of optically corrected laser diodes that can be actively cooled. The laser diode array may also be used non-optically corrected depending on the application. The laser diode array may be operated in a long duty cycle, or in continuous operation. A number of laser diode bars and a single large area microchannel heat sink are thermally coupled in a high density surface emitting type geometry. The laser diodes are placed in an array of 90° shaped v-grooves that are precisely placed on the cooler surface and the laser diode emitting surface is placed in close proximity to the v-groove edge. A frame with the same v-groove pitch is used for the precision mounting of the microlenses. The term "pitch" as used herein, refers to the number of elements per unit length. The laser diode array and the microlense array are relatively precisely positioned and secured for minimizing beam divergence. Larger arrays can be constructed by the assembly of any number of these laser diode array modules. The laser diode array pitch is dependent on the laser diode bar cavity length and the mounting angle of the laser diode array, for example a pitch of 33 laser diode bars per centimeter is obtained if the laser diode bar cavity length is 300 μm and the array mounting angle is 45°. The cooling means includes a microchannel heat sink that is attached proximate to the laser diode bar so that it absorbs heat generated by laser operation. The laser diode array with active cooling has applications as an optical pump for high power solid state lasers. Further, it can be incorporated in military and space applications, and it can be useful in applications that have space constraints and energy limitations.

Figure 1:
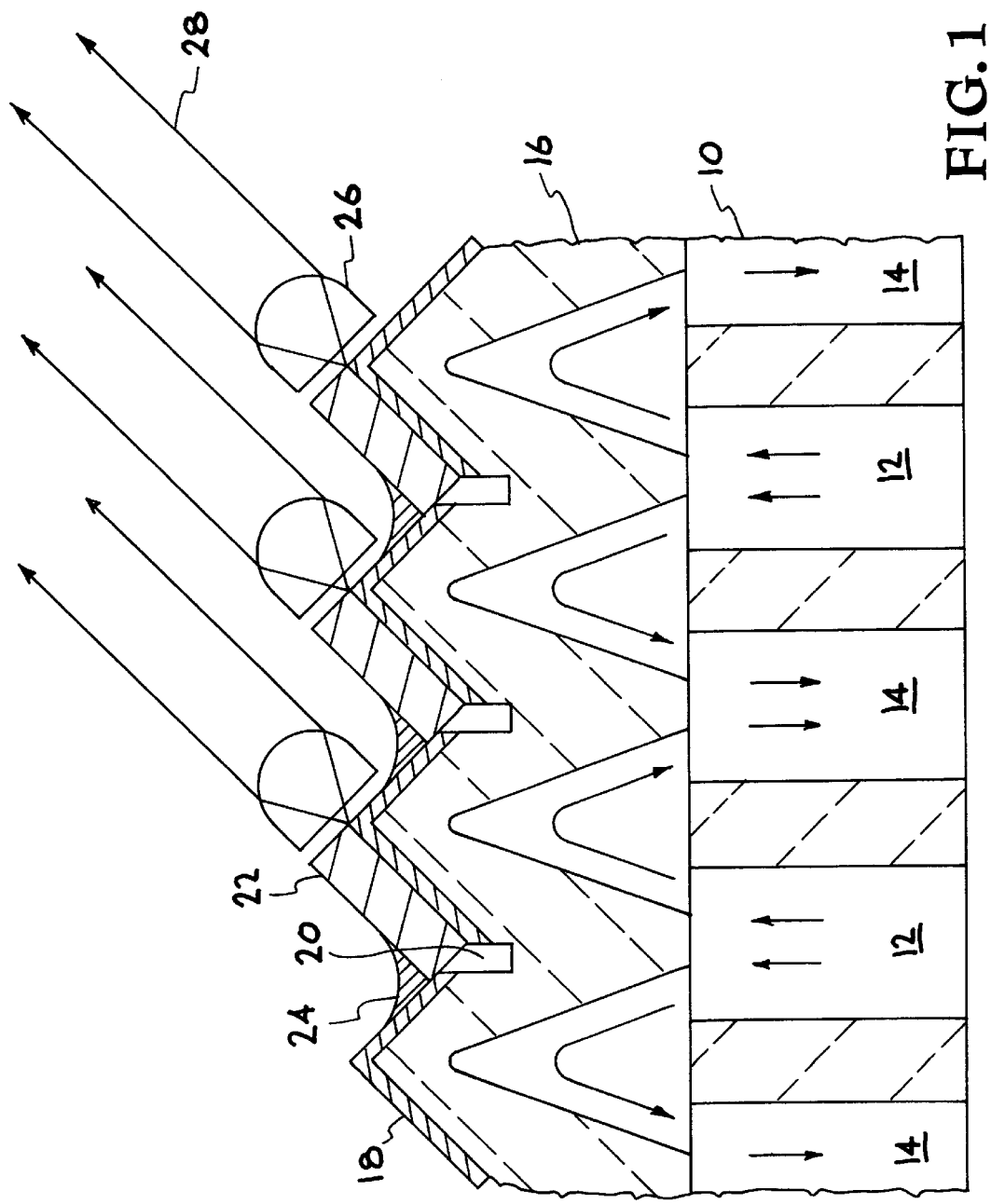
FIG. 1, shows the basic concept of laser diodes placed onto a microchannel cooled type submount in a series of v-grooves.

FIG. 1 shows the basic concept of laser diodes placed onto a microchannel cooled type submount in a series of v-grooves. This sketch shows the fundamental electrical circuitry, and microlense placement. Water manifold 10, comprising inlet ports 12 and exit ports 14, is connected to the angular groove microchannel cooler 16. In the figure, water enters and exits angular groove microchannel cooler 16 through inlet ports 12 exit ports 14 respectively. Angular groove microchannel cooler 16 comprises metalization layer 18, which has its electrical continuity broken by electrical isolation break 20. Laser diode bars 22 are located against the metalization layer 18 and are soldered into place with solder 24. Microlenses 26 are located in proximity to the output face of laser diode bars 22 such that the output beam 28 is collimated. One type of microchannel heatsink or angular groove microchannel cooler usable in accordance with the present invention is disclosed in U.S. Pat. No. 5,548,605, which is fully incorporated herein by reference.

Figure 2:
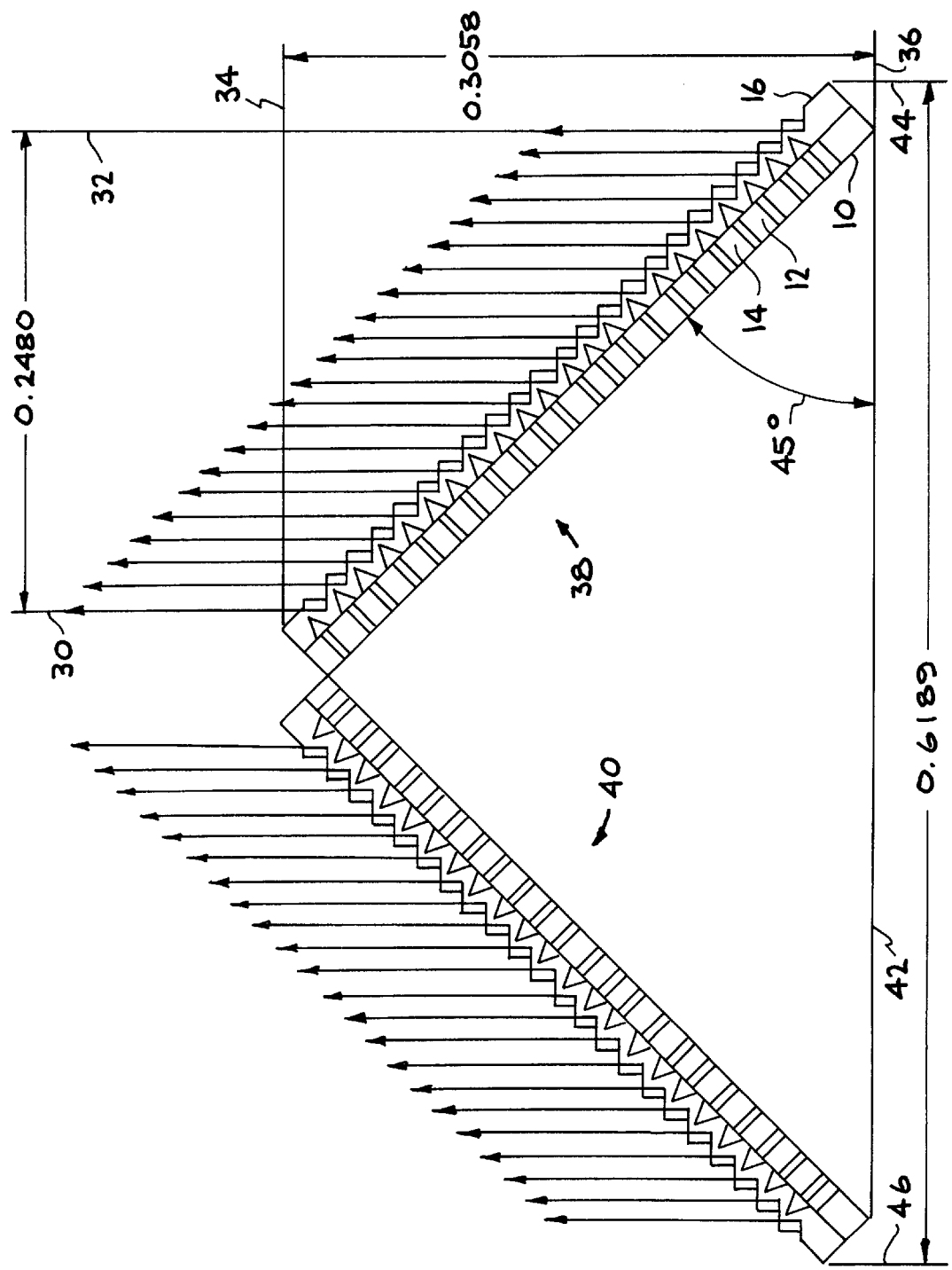
FIG. 2 shows how the effective laser diode pitch is increased by tilting the array at 45°.

FIG. 2 illustrates a configuration where two laser diode arrays are tilted at 45°. Identical to the embodiment shown in FIG. 1, this configuration comprises water manifold 10, comprising inlet ports 12 and exit ports 14, is connected to the angular groove microchannel cooler 16. In the figure, a single 1 cm long array comprises 33 diodes per centimeter. The length from inner beams 30 to outer beams 32 is 0.63 cm (0.2480 in.). The length from the upper edge 34 of the laser diode array substrate to the lower edge 36 of the water manifold when the array is tiled at 45° is 0.77 cm (0.3058 in.). When laser diode array 38 is tilted 90° with respect to laser diode array 40 (45° with respect to the base 42), as shown in the figure, the distance from outer edge 44 to outer edge 46 is 1.57 cm (0.6189 in.). It can be seen from the figure that laser diodes packaged in this manner will produce a very high density of laser output beams, which density is dependent on the laser diode bar cavity length and the mounting angle of the laser diode array.

Figure 3:
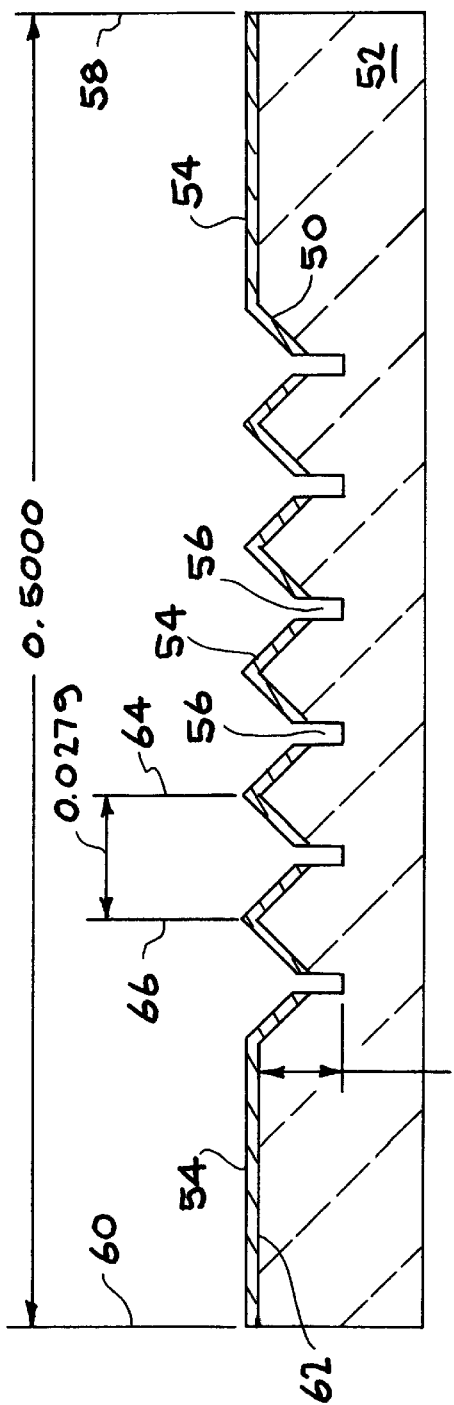
FIG. 3 shows an example on how the microchannel cooler surface would appear after the first 3 manufacturing steps

FIG. 3 shows the results of the first three (3) steps for manufacturing the laser diode array microchannel v-groove surface. First, v-groove 50 is formed in substrate 52 by either cutting or etching. Next, a metalization layer 54 is placed on the surface of substrate 52. The metalization layer is separated into individual contact pads through the formation, by cutting, of the electrical isolation groove or break 56. The break 56 location should be at the trough of v-groove 50, and its location is critical to the operation of the laser diode array. The slot depth is not critical, but should be deep enough such that the shadow formed in the metalization layer deposition process does not allow opposite sides of the groove 56 to maintain electrical continuity, as illustrated in FIG. 4. In FIG. 3, the end 58 to end 60 length of substrate 52 is 0.5000 inches. The thickness of substrate 52 from surface 62 to the bottom of isolation break 56 is 0.0183 inches. The isolation break depth is not critical, as discussed above, and in this embodiment has a tolerance of ±0.0010 inches. The length from crest 64 to crest 66 is 0.0279 inches.

FIG. 4A shows an example on how to apply solder without metalizing across the electrical isolation groove. The v-groove monolithic submount 70 is oriented at a 45° with respect to the deposition crucible 72. Submount 70 may comprise silicon. As deposition crucible 72 heats up a metal placed therein to the boiling point, a metal vapor 74 flows toward the v-groove monolithic submount 70. FIG. 4B shows the completed metalization layer of FIG. 4A. Due to the angular orientation of submount 70, metalization break 73 is not within a direct line-of sight with deposition crucible 72, thus preventing metal from entering the metalization break 73, thereby breaking the electrical continuity between laser diode bond pads 76 and 78. To further assure that electrical continuity is not created during the metal deposition step, a wire 79 having a diameter less than the width of the metalization break 73 may be temporally placed therein.

Figure 5:
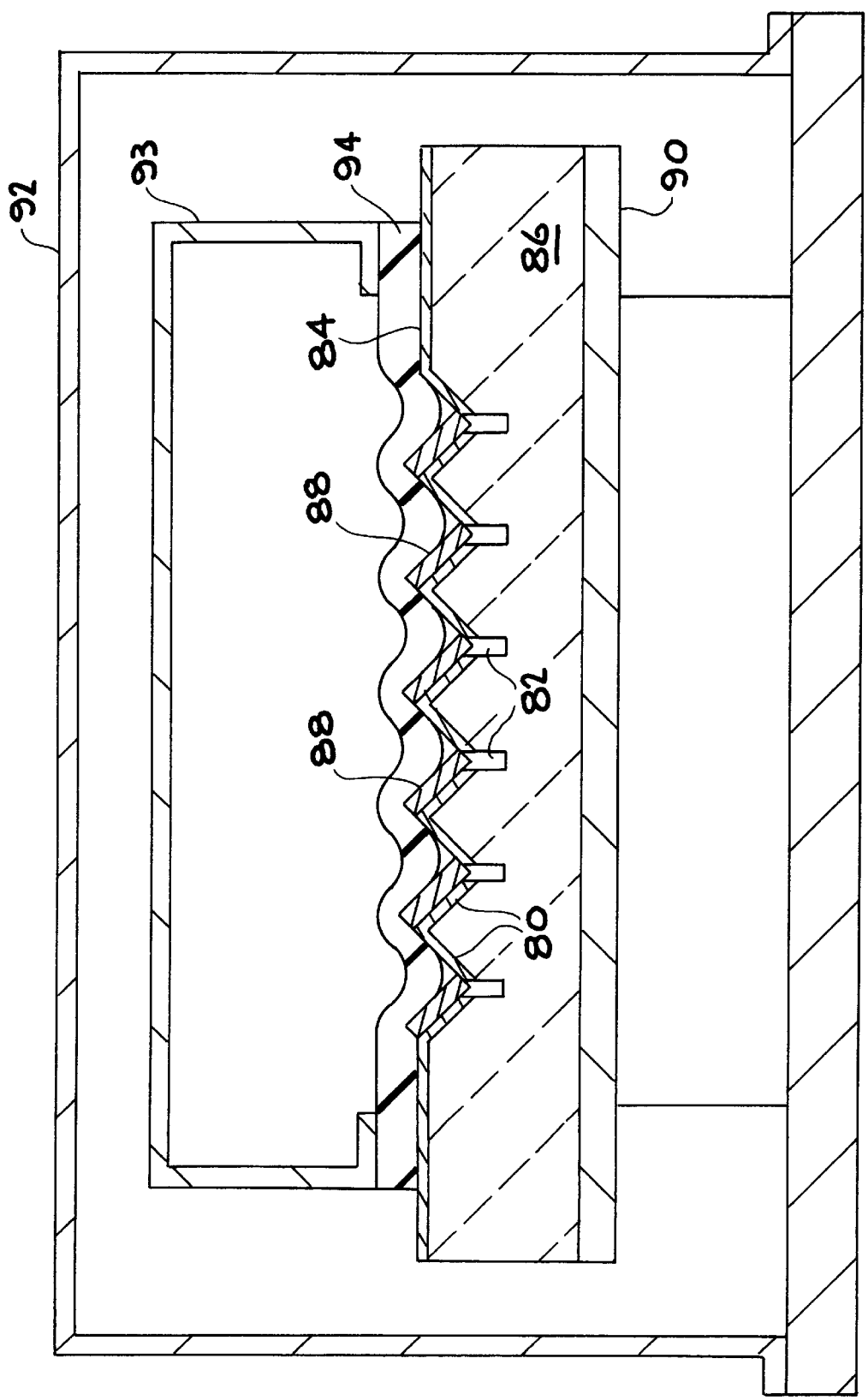
FIG. 5 shows a technique for holding the diodes in place during the soldering operation.

Referring to FIG. 5, after the v-grooves 80, metalization break 82 and metalization layer 84 have been formed in silicon submount 86, the laser diode bars 88 must be soldered in place. The figure illustrates a technique for holding the diodes in place during the soldering process. The soldering of the laser diode bars 88 to the micro-channel cooled v-groove submount 86 by is done by vapor depositing a thin film of indium onto the entire surface of the submount that the laser diode will mount to. The laser diode bars 88 are then placed into position. The assembly is then placed onto a heater plate 90 that is mounted inside a vacuum chamber 92. In order to do a flux free soldering process all the air is removed and then a reactive gas (hydrogen) is purged into the vacuum chamber 92 with a flowing pressure of approximately 10 torr. To assure a good bond of the laser diode to the micro-channel cooled v-groove submount 86, some means of pressing the laser diodes 88 against the submount is required. A fixture 93 with a 0.010" thick silicone sheet bladder 94 and a trapped volume of 1 atm of air is placed and secured over the unsoldered laser diode array. When the pressure is reduced in the vacuum chamber the bladder will inflated. The bladder will conform over the laser diode bars and the submount, thus applying a force to push the laser diode bars into the submount. The hot plate is heated to the melting point of Indium, and then cooled, thus completing the soldering of the laser diode bars.

Figures 6A, 6B:
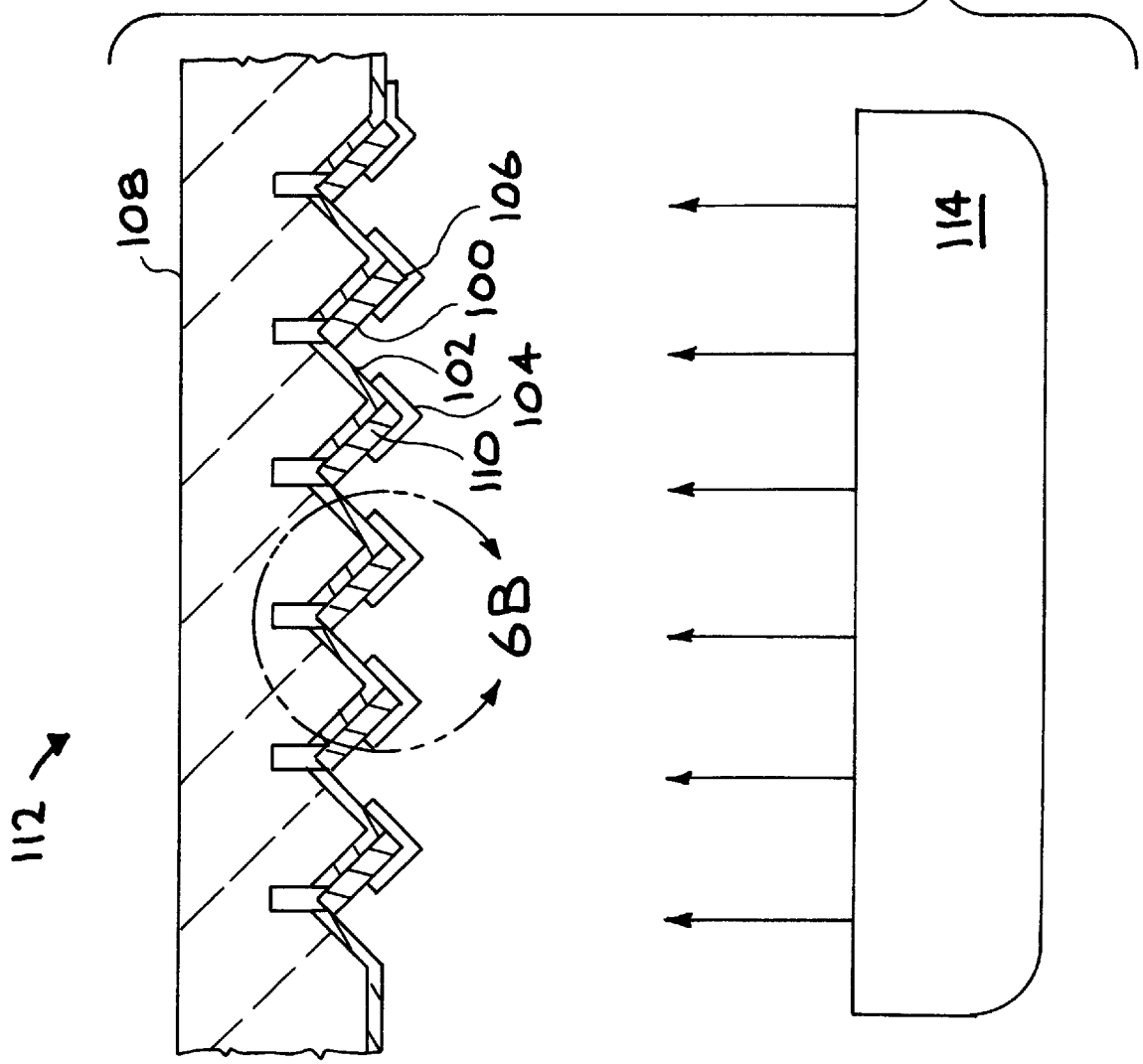
FIGS. 6A and 6B show a technique for making an electrical contact to the diode electrical contact pad to the neighboring microchannel cooler electrical contact pad.

FIG. 6A shows a technique for making electrical contact from the diode electrical contact pads 100 to the neighboring microchannel cooler electrical contact pads 102. Laser diode facet masks 104 are placed over the crest 106 of the submount 108, as well as over the output face of the laser diodes 110 leaving exposed a portion of each of the diode electrical contact pads 100 and the microchannel cooler electrical contact pads 102. The entire laser diode array 112 is inverted over an indium deposition crucible 114 which provides indium vapor to the exposed portions of the laser diode array 112, thereby providing electrical contact between the diode electrical contact pads 100 and the microchannel cooler electrical contact pads 102. FIG. 6B shows a magnified view of a section of laser diode array 112 including the submount 108, metalization breaks 116, metalization layer 118, laser diode bars 110 and laser diode facet masks 104.

Figure 7A:
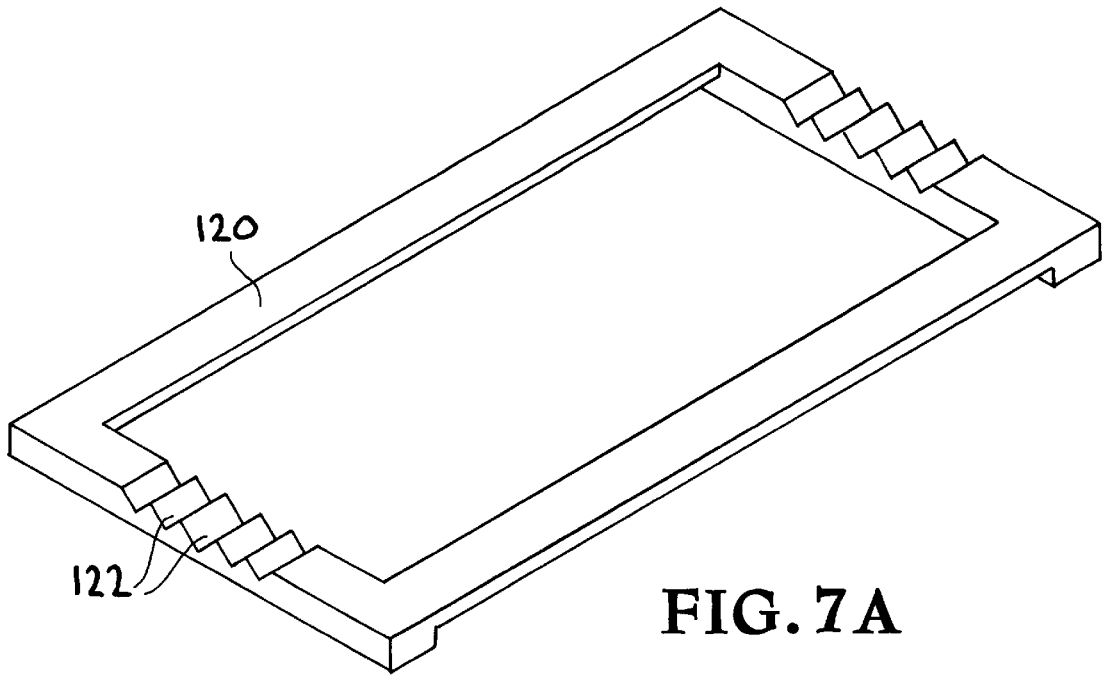
FIGS. 7A–7D shows an example of a v-groove lens frame and how it would mount to a v-groove type laser diode array.
Figure 7B:
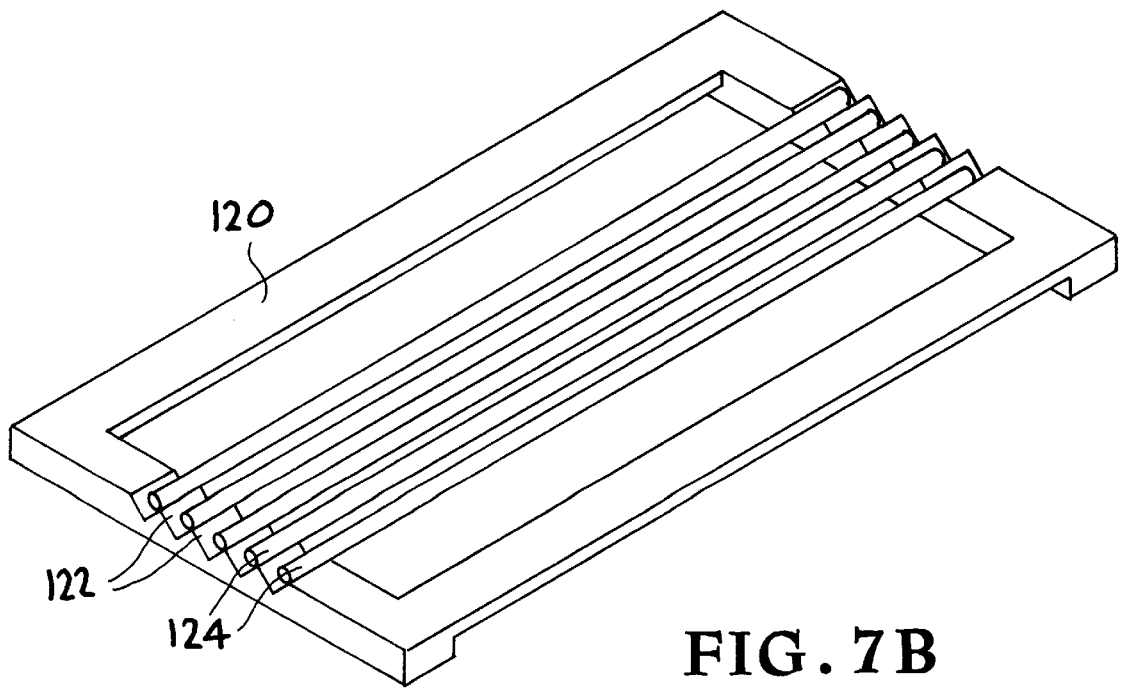
Figure 7C:
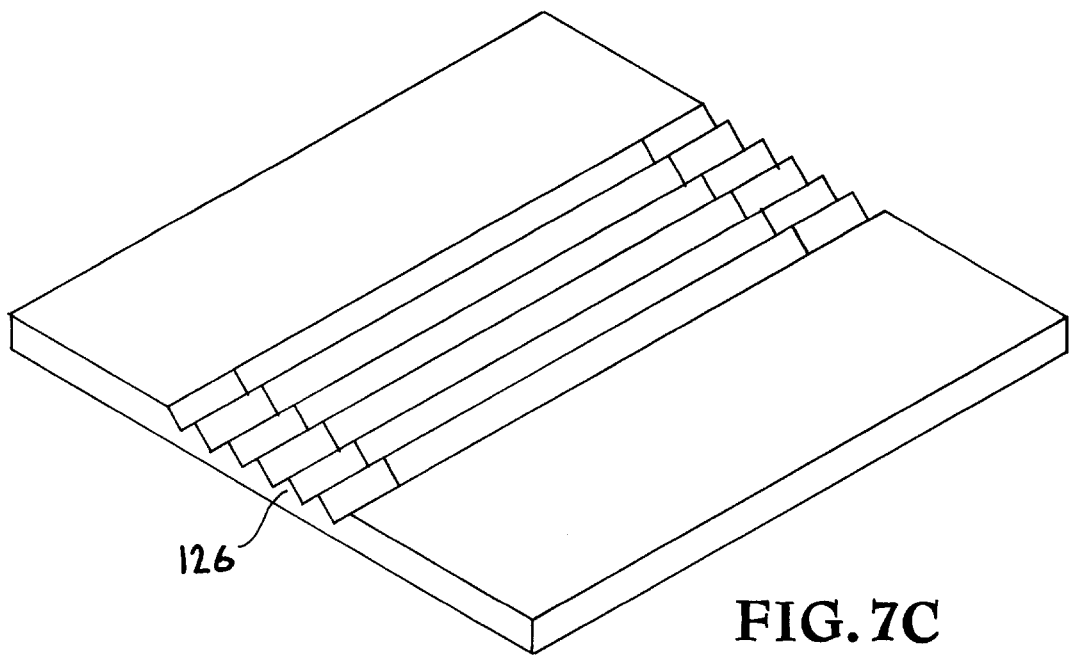
Figure 7D:
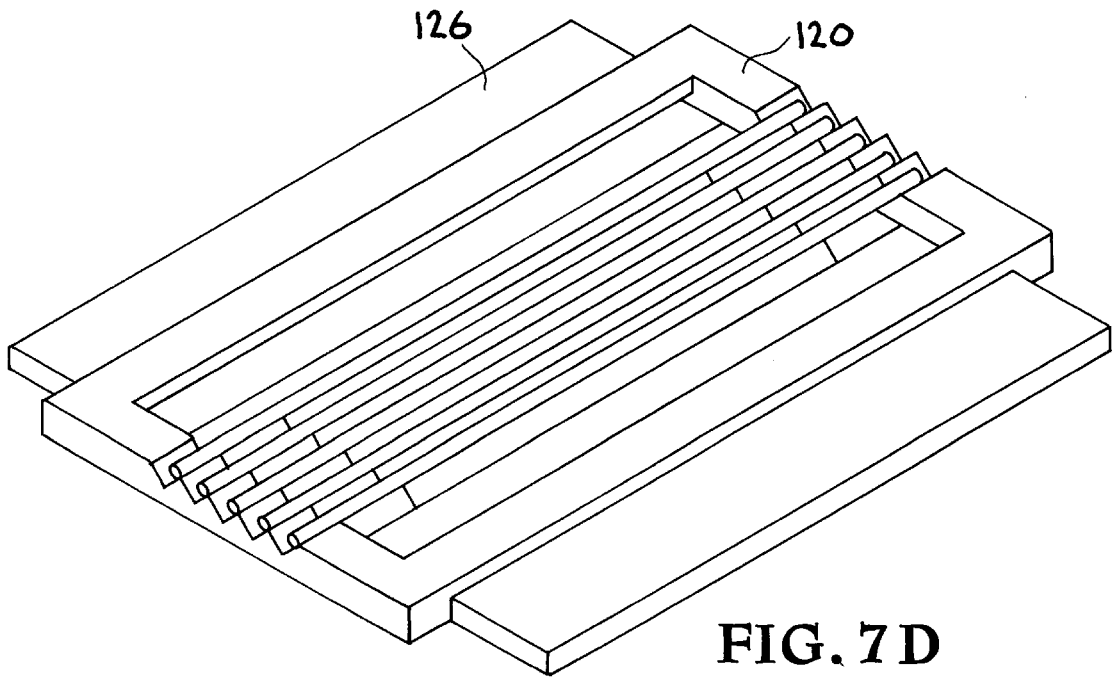

FIGS. 7A–7D shows an example of a v-groove lens frame and how it would mount to a v-groove type laser diode array. FIG. 7A shows a lens frame 120 comprising a series of v-grooves 122. Methods of making and using lens frames are described in commonly assigned co-pending patent application Ser. No. 08/753,656, entitled "Microlens Frames For Laser Diode Arrays" which is incorporated herein by reference. FIG. 7B shows lens frame 120 with lenses 124 placed in the v-grooves 122. FIG. 7C shows a v-groove monolithic laser diode array 126 and FIG. 7D shows the assembled lens frame 120 placed over the v-groove monolithic laser diode array 126.

Figure 8:
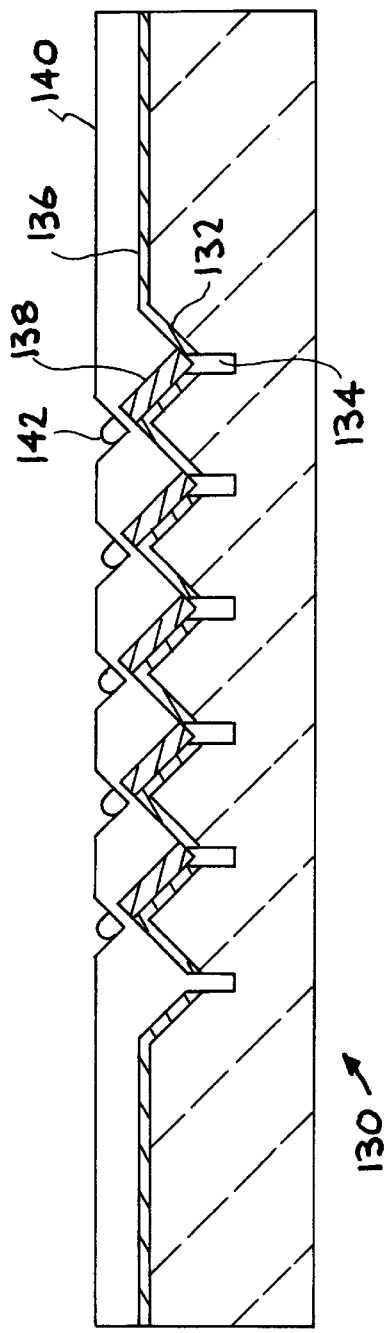
FIG. 8 shows a cross sectional view of v-groove lens frame with lenses, and a v-groove laser diode array.

FIG. 8 shows a cross sectional view of a v-groove lens frame with lenses, and a v-groove laser diode array. In the figure, laser diode array 130 comprises v-grooves 132 having a metalization break 134 and a metalization layer 136. Laser diode bars 138 are placed within the v-grooves 132 and soldered into place. The micro-lens frame 140 and lenses 142 are placed over the laser diode array 130 in such a manner that light from the output facet of the laser diode bars 138 is collimated by the microlenses 142.

Changes and modifications in the specifically described embodiments can be carried out without departing from the scope of the invention, which is intended to be limited by the scope of the appended claims.

The invention claimed is:

1. A laser diode array, comprising:
   a substrate having an upper surface and a lower surface;
   a plurality of v-grooves formed in said upper surface;
   a metalization layer formed on said upper surface and within said plurality of v-grooves;
   a metalization break formed in each v-groove of said plurality of v-grooves; and
   a plurality of laser diode bars, wherein a single laser diode bar of said plurality of laser diode bars is placed within each v-groove of said plurality of v-grooves.

2. The laser diode array of claim 1, further comprising means for cooling said laser diode array.

3. The laser diode array of claim 2, wherein each laser diode bar of said plurality of laser diode bars comprises an output facet, wherein said laser diode array further comprises a plurality of microlenses, wherein a single microlens of said plurality of microlenses is placed on each said output facet such that light coupled out of each said laser diode bar is substantially collimated.

4. The laser diode array of claim 3, wherein said laser diode bars are spaced apart with a pitch of 33 laser diode bars per centimeter.

5. The laser diode array of claim 3, wherein said plurality of v-grooves comprises a series of symmetrically fabricated 90° v-grooves.

6. The laser diode array of claim 3, wherein said upper surface of said substrate comprises surface flatness of less than 10 microns variation, said plurality of v-grooves further comprising an absolute v-groove positioning accuracy of less than 10 micron variation and a v-groove surface texture of less than 1 micron variation.

7. The laser diode array of claim 3, further comprising a microlense mounting frame comprising:
   a second plurality of v-grooves with an identical pitch as that of said laser diode array, wherein said second plurality v-grooves comprise a series of symmetrically fabricated 90° v-shaped grooves;
   an overall mounting frame surface flatness having less than 10 microns variation;
   an absolute v-groove positioning accuracy of less than 10 microns variation; and
   wherein said second plurality of v-grooves comprises a surface texture of less than 1 micron variation.

8. The laser diode array of claim 3, wherein at least one optically corrected two dimensional laser diode array can be mounted on a mounting plate that can be set from 0° to 45°, depending on the application, wherein the effective laser diode density increases as the mounting angle increases, wherein the effective laser diode density is maximized at 45°.

9. The laser diode array of claim 2, wherein said means for cooling said laser diode array comprise a monolithic microchannel heatsink, comprising:
   a substrate;
   a plurality of parallel laser diode bar slots formed in a first side of said substrate; and
   a plurality of parallel microchannels formed in a second side of said substrate;
   wherein said plurality of parallel microchannels are oriented at an angle Ø with respect to said plurality of parallel laser diode bar slots, where 90°>Ø>0°.

* * * * *